(12) United States Patent
Oie et al.

(10) Patent No.: US 11,479,744 B2
(45) Date of Patent: Oct. 25, 2022

(54) COMPOSITION HAVING SUPPRESSED ALUMINA DAMAGE AND PRODUCTION METHOD FOR SEMICONDUCTOR SUBSTRATE USING SAME

(71) Applicant: MITSUBISHI GAS CHEMICAL COMPANY, INC., Chiyoda-ku (JP)

(72) Inventors: Toshiyuki Oie, Katsushika-ku (JP); Akinobu Horita, Katsushika-ku (JP); Kenji Yamada, Katsushika-ku (JP); Takahiro Kikunaga, Katsushika-ku (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 0 days.

(21) Appl. No.: 16/976,614

(22) PCT Filed: Feb. 27, 2019

(86) PCT No.: PCT/JP2019/007408
§ 371 (c)(1),
(2) Date: Aug. 28, 2020

(87) PCT Pub. No.: WO2019/167970
PCT Pub. Date: Sep. 6, 2019

(65) Prior Publication Data
US 2021/0002591 A1 Jan. 7, 2021

(30) Foreign Application Priority Data
Mar. 2, 2018 (JP) .............................. JP2018-037143

(51) Int. Cl.
*C11D 3/04* (2006.01)
*C11D 11/00* (2006.01)
(Continued)

(52) U.S. Cl.
CPC ............ *C11D 11/0047* (2013.01); *C11D 7/08* (2013.01); *C11D 7/105* (2013.01); *C11D 7/265* (2013.01);
(Continued)

(58) Field of Classification Search
CPC .................................................. C11D 11/0047
(Continued)

(56) References Cited

U.S. PATENT DOCUMENTS 10,377,978 B2 * 8/2019 Oie ......................... C11D 7/105
10,629,426 B2 * 4/2020 Oie ..................... H01L 21/0206
(Continued)

FOREIGN PATENT DOCUMENTS

CN 101681130 A 3/2010
EP 1 808 480 A1 7/2007
(Continued)

OTHER PUBLICATIONS

Extended European Search Report dated Mar. 31, 2021 in European Patent Application No. 19761160.1, 7 pages.
(Continued)

*Primary Examiner* — Gregory E Webb
(74) *Attorney, Agent, or Firm* — Oblon, McClelland, Maier & Neustadt, L.L.P.

(57) ABSTRACT

The present invention pertains to: a composition capable of removing dry etching residue present on the surface of a semiconductor integrated circuit, while suppressing alumina damage in a production process for the semiconductor integrated circuit; a cleaning method for semiconductor substrates that use alumina; and a production method for a semiconductor substrate having an alumina layer. This composition is characterized by containing 0.00005%-1% by mass of a barium compound (A) and 0.01%-20% by mass of a fluorine compound (B) and having a pH of 2.5-8.0.

18 Claims, 4 Drawing Sheets

(51) Int. Cl.
*C11D 7/08* (2006.01)
*C11D 7/10* (2006.01)
*C11D 7/26* (2006.01)
*C11D 7/32* (2006.01)
*C11D 7/50* (2006.01)
*H01L 21/02* (2006.01)

(52) U.S. Cl.
CPC .......... *C11D 7/3281* (2013.01); *C11D 7/5022* (2013.01); *H01L 21/02057* (2013.01)

(58) Field of Classification Search
USPC .......................................................... 510/175
See application file for complete search history.

(56) References Cited

U.S. PATENT DOCUMENTS

| | | | | |
|---|---|---|---|---|
| 10,651,028 | B2* | 5/2020 | Oie | ................ C11D 17/08 |
| 2003/0004075 | A1 | 1/2003 | Suto et al. | |
| 2008/0050895 | A1* | 2/2008 | Miyairi | .............. H01L 27/1214 |
| | | | | 438/507 |
| 2008/0070393 | A1* | 3/2008 | Miyairi | ............. H01L 29/66765 |
| | | | | 438/585 |
| 2008/0121725 | A1* | 5/2008 | Nomura | ................. B82Y 10/00 |
| | | | | 235/492 |
| 2017/0081553 | A1* | 3/2017 | Tamada | .................. B24B 37/00 |
| 2017/0233687 | A1* | 8/2017 | Oie | ..................... H01L 21/0206 |
| | | | | 510/176 |
| 2017/0240850 | A1* | 8/2017 | Oie | .......................... C11D 7/08 |
| 2017/0335248 | A1* | 11/2017 | Oie | ................... H01L 21/31133 |
| 2019/0177670 | A1 | 6/2019 | Kamimura | |

FOREIGN PATENT DOCUMENTS

| | | |
|---|---|---|
| EP | 3 193 359 A1 | 7/2017 |
| EP | 3 220 408 A1 | 9/2017 |
| EP | 3 220 409 A1 | 9/2017 |
| JP | 2001-249465 A | 9/2001 |
| WO | WO 2016/076032 A1 | 5/2016 |
| WO | WO 2016/076033 A1 | 5/2016 |
| WO | WO 2018/061670 A1 | 4/2018 |

OTHER PUBLICATIONS

International Search Report dated May 28, 2019 in PCT/JP2019/007408 filed Feb. 27, 2019, 2 pages.
Bakke, et al., "Etch Stop Materials for Release by Vapor HF Etching", 16$^{th}$ MME workshop, Goeteborg, Sweden, 4 total pages.
Padmanaban, et al., "Progress in Spin-on Hard Mask Materials for Advances Lithography", Journal of Photopolymer Science and Technology, vol. 27, No. 4, 2014, pp. 503-509.

* cited by examiner

COMPOSITION HAVING SUPPRESSED ALUMINA DAMAGE AND PRODUCTION METHOD FOR SEMICONDUCTOR SUBSTRATE USING SAME

TECHNICAL FIELD

The present invention relates to a composition, which can suppress damage to alumina and remove a dry etching residue existing on a surface of a semiconductor integrated circuit in the process of producing the semiconductor integrated circuit, and a method for producing a semiconductor substrate using the same.

BACKGROUND ART

In the process of dry etching of a semiconductor integrated circuit, in general, a residue derived from an etching gas component, a layer to be etched, a mask layer (resist, hard mask, etc.), etc. (referred to as a dry etching residue) is generated. If the next process is carried out without removing the dry etching residue, the yield rate is reduced. For this reason, the process of removing the dry etching residue is required.

When a dry etching residue is removed with oxygen plasma, there is a problem that materials exposed to oxygen plasma or the like are damaged, resulting in significant deterioration of electrical characteristics. For this reason, it is desired to employ a method of removing a dry etching residue at a level comparable to that of an oxygen plasma process while preventing damage to other materials.

When dry etching is carried out until cobalt as a wiring material is reached, cobalt is exposed to a dry etching gas, resulting in change in quality thereof, and it may affect electrical properties. For this reason, a process, wherein: an etch stop layer is provided on cobalt; a via is formed by dry etching until the etch stop layer is reached; and then the etch stop layer at the bottom of the via is removed by a method having a small influence on cobalt to bare cobalt, is considered.

When forming a via by dry etching, a fluorine-based gas is generally selected. In this regard, when alumina is selected as an etch stop layer, since alumina is highly resistant to the fluorine-based gas, it advantageously functions as the etch stop layer even in the form of a thin film (Non-Patent Literature 1).

In the case of selecting alumina as the etch stop layer, in the process of removing the dry etching residue, damage to alumina is required to be suppressed at the same time, and a liquid agent which can achieve this is desired.

Further, not only damage to alumina, but also damage to cobalt and a low-dielectric-constant interlayer dielectric film may also be required to be suppressed depending on the constitution of a substrate.

As a hard mask to be used as a mask at the time of dry etching, silicon-based and titanium-based hard masks are generally used, but recently, there is an example in which a zirconia-based hard mask is used (Non-Patent Literature 2). Therefore, when a zirconia-based hard mask is used, zirconia is contained in the dry etching residue.

CITATION LIST

Non-Patent Literature

Non-Patent Literature 1: 16th MME workshop, Goeteborg, Sweden, 2005 "Etch stop materials for release by vapor HF etching"

Non-Patent Literature 2: M Padmanaban et al., J. Photopolym. Sci. Technol., 27 (2014) 503

SUMMARY OF INVENTION

Technical Problem

The problem to be solved by the present invention is to provide a composition, which suppresses damage to alumina, and which can remove a dry etching residue, and a method for producing a semiconductor substrate using the same.

Solution to Problem

The present inventors diligently made researches and found that the above-described problem can be solved by the below-described invention. The present invention is as described below.

[1] A composition, which contains 0.00005 to 1% by mass of a barium compound (A) and 0.01 to 20% by mass of a fluorine compound (B), and which has a pH of 2.5 to 8.0.

[2] The composition according to item [1], wherein the barium compound (A) includes at least one selected from the group consisting of barium nitrate, barium acetate, barium chloride, barium hydroxide, barium sulfite, barium chlorate, barium perchlorate, barium peroxide, barium chromate, barium oxide, barium cyanide, barium bromide, barium carbonate, barium metaborate, barium iodide, barium tetrafluoroborate, barium sulfate and barium sulfide.

[3] The composition according to item [1], wherein the barium compound (A) includes at least one selected from the group consisting of barium nitrate, barium acetate, barium chloride and barium hydroxide.

[4] The composition according to any one of items [1] to [3], wherein the fluorine compound (B) includes hydrofluoric acid or a fluoride salt.

[5] The composition according to any one of items [1] to [4], which has a pH of 3.1 to 7.4.

[6] The composition according to any one of items [1] to [5], wherein the content of hydrogen peroxide is less than 0.002% by mass.

[7] The composition according to any one of items [1] to [6], which further contains 0.01 to 10% by mass of a benzotriazole compound (C).

[8] The composition according to any one of items [1] to [7], which further contains 0.0005 to 1% by mass of a compound (D) having a pyrrolidone structure.

[9] The composition according to any one of items [1] to [8], wherein the etching rate of alumina at 50° C. is 40 Å/min ($4.0 \times 10^{-9}$ m/min) or lower.

[10] The composition according to any one of items [1] to [9], wherein the etching rate of cobalt at 50° C. is 1.0 Å/min ($1.0 \times 10^{-10}$ m/min) or lower.

[11] The composition according to any one of items [1] to [10], wherein the etching rate of a low-dielectric-constant interlayer dielectric film at 50° C. is 1.0 Å/min ($1.0 \times 10^{-10}$ m/min) or lower.

[12] The composition according to any one of items [1] to [11], which is used for removing a dry etching residue on a semiconductor substrate having an alumina layer.

[13] A method for producing a semiconductor substrate having an alumina layer, wherein the composition according to any one of items [1] to [12] is used. Note that the production method of the present invention includes removing a dry etching residue using the composition according to any one of items [1] to [12].

[14] A method for washing a semiconductor substrate having an alumina layer, which includes removing a dry etching residue using the composition according to any one of items [1] to [12].

Advantageous Effects of Invention

According to a preferred embodiment of the present invention, by using the composition of the present invention, it is possible to remove a dry etching residue on a surface of a product to be treated while suppressing damage to alumina in the process of producing a semiconductor circuit, and it is possible to produce a semiconductor substrate having high precision and high quality with a high yield.

DESCRIPTION OF EMBODIMENTS

Figure 1:
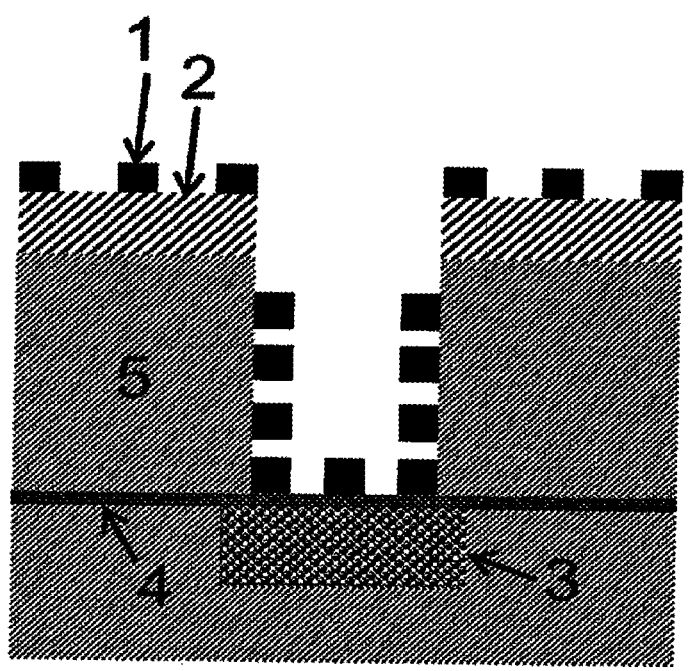
FIG. 1 is a schematic cross sectional view of a semiconductor substrate prior to removal of a dry etching residue, which has a structure comprising a low-dielectric-constant interlayer dielectric film, cobalt or cobalt alloy, alumina and a titanium-based hard mask, wherein the bottom of a via is alumina, according to one embodiment.

The composition of the present invention contains a barium compound (A) and a fluorine compound (B). Hereinafter, these materials will be described in detail.
[Barium Compound (A)]
The barium compound (A) of the present application is a barium-containing inorganic substance and has the effect of preventing the corrosion of alumina.

Specific examples of the barium compound (A) include barium nitrate, barium acetate, barium chloride, barium hydroxide, barium sulfite, barium chlorate, barium perchlorate, barium peroxide, barium chromate, barium oxide, barium cyanide, barium bromide, barium carbonate, barium metaborate, barium iodide, barium tetrafluoroborate, barium sulfate, barium sulfide, and salts obtained by reacting barium hydroxide with an acid. These materials may be used solely, or two or more of them may be used in combination.

Among them, barium nitrate, barium acetate, barium chloride and barium hydroxide are preferred because these have high water solubility and can be easily obtained.

The concentration (content) of the barium compound (A) in the composition is 0.00005 to 1% by mass, preferably 0.00025 to 0.75% by mass, more preferably 0.001 to 0.1% by mass, and particularly preferably 0.004 to 0.06% by mass. When the concentration is within the above-described range, damage to alumina can be effectively suppressed.
[Fluorine Compound (B)]
The fluorine compound (B) of the present invention is a compound containing a fluorine atom (but compounds having a carbon-fluorine (C—F) bond are excluded), and specific examples thereof include hydrofluoric acid, a fluoride salt, tetrafluoroboric acid, a tetrafluoroborate, hexafluorosilicic acid, a hexafluorosilicate, hexafluorophosphoric acid and a hexafluorophosphate.

In this regard, the fluoride salt is not particularly limited as long as it is a salt of hydrofluoric acid and an inorganic alkali or organic alkali. Preferred specific examples of the fluoride salt include ammonium fluoride, lithium fluoride, sodium fluoride, potassium fluoride, rubidium fluoride, cesium fluoride, beryllium fluoride, magnesium fluoride, calcium fluoride, strontium fluoride, tetramethylammonium fluoride, tetraethylammonium fluoride, tetrapropylammonium fluoride and tetrabutylammonium fluoride.

The fluorine compound (B) has the effect of removing a dry etching residue. Among the above-described materials, hydrofluoric acid and the fluoride salt are preferred because these have high removability for a dry etching residue and can be easily obtained. Further, the above-described materials may be used solely, or two or more of them may be used in combination.

The concentration (content) of the fluorine compound (B) in the composition is 0.01 to 20% by mass, preferably 0.02 to 17.5% by mass, more preferably 0.03 to 15.0% by mass, and particularly preferably 0.05 to 10.0% by mass. When the concentration is within the above-described range, damage to alumina can be effectively suppressed.
[Benzotriazole Compound (C)]
In the present invention, a benzotriazole compound (C) may be added in order to improve anticorrosion property for cobalt or a cobalt alloy.

The benzotriazole compound (C) is a compound having a benzotriazole skeleton, and specific examples thereof include benzotriazole, 5-methyl-1H-benzotriazole and 2,2'-[[(methyl-1H-benzotriazol-1-yl)methyl]imino]bisethanol. Other compounds having a benzotriazole skeleton can also be used. These materials may be used solely, or two or more of them may be used in combination.

When using the benzotriazole compound (C), the concentration (content) thereof in the composition is usually 0.01 to 10% by mass, preferably 0.025 to 7.5% by mass, more preferably 0.05 to 5.0% by mass, and particularly preferably 0.1 to 1.0% by mass. When the concentration is within the above-described range, damage to cobalt or a cobalt alloy can be effectively suppressed.
[Compound (D) Having Pyrrolidone Structure]
In the present invention, a compound (D) having a pyrrolidone structure may be added in order to improve anticorrosion property for a low-dielectric-constant interlayer dielectric film and cobalt or a cobalt alloy.

The compound (D) having the pyrrolidone structure to be used in the present invention is an oligomer or polymer whose repeating unit includes a pyrrolidone unit, and specific examples thereof include polyvinylpyrrolidone, a random copolymer containing a pyrrolidone unit, an alternating copolymer containing a pyrrolidone unit, a block copolymer containing a pyrrolidone unit, and a branched polymer containing a pyrrolidone unit.

The weight average molecular weight of the compound (D) having the pyrrolidone structure is usually 1000 to 5000000, preferably 1300 to 3500000, more preferably 1600 to 2800000, and particularly preferably 2000 to 1200000, and the ratio of the repeating unit of the pyrrolidone unit in the compound (D) having the pyrrolidone structure is usually 50% or more, preferably 60% or more, more preferably 65% or more, and particularly preferably 70% or more. When these are within the above-described ranges, damage to a low-dielectric-constant interlayer dielectric film and cobalt or a cobalt alloy can be effectively suppressed.

As the compound (D) having the pyrrolidone structure, for example, PITZCOL (trademark) series manufactured by DKS Co. Ltd. are available and can be suitably used.

When using the compound (D) having the pyrrolidone structure, the concentration (content) of the compound (D) having the pyrrolidone structure in the composition is usually 0.0005 to 1% by mass, preferably 0.001 to 0.75% by mass, more preferably 0.002 to 0.5% by mass, and particularly preferably 0.003 to 0.1% by mass. When the concentration is within the above-described range, damage to a low-dielectric-constant interlayer dielectric film and cobalt or a cobalt alloy can be effectively suppressed.

[Other Components]

In the composition of the present invention, if desired, a component which is conventionally used in compositions for semiconductors may be blended within a range in which the purpose of the present invention is not impaired.

For example, as a solvent, diethylene glycol monobutyl ether can be added, and as an additive, an alkali, an acid, a chelating agent, a surfactant, a defoaming agent, an oxidant, a reducing agent, a metal anticorrosive, a water-soluble organic solvent, etc. can be added.

[Water]

The remaining portion of the composition of the present invention is water. The water which can be used in the present invention is not particularly limited, but it is preferably water from which metal ions, organic impurities, particles, etc. have been removed by distillation, ion exchange treatment, filtering treatment, adsorption treatment or the like. Pure water is more preferred, and ultrapure water is particularly preferred.

The concentration (content) of water in the composition is preferably 45 to 100% by mass, more preferably 90 to 100% by mass, and even more preferably 95 to 100% by mass.

[Method for Preparing Composition]

The composition of the present invention is prepared by adding water (preferably ultrapure water) to the barium compound (A), the fluorine compound (B), and according to need, the other components and stirring the mixture until it becomes homogeneous.

The pH value of the composition is 2.5 to 8.0, preferably 2.7 to 7.8, more preferably 2.9 to 7.6, and particularly preferably 3.1 to 7.4, and it is even more preferably lower than 7.0, and still more preferably 3.1 to 6.5. When the pH value is within the above-described range, a dry etching residue can be removed while effectively suppressing damage to cobalt or a cobalt alloy, alumina, a low-dielectric-constant interlayer dielectric film and silicon nitride.

Note that it is preferred that the composition of the present invention substantially does not contain hydrogen peroxide, and it is more preferred that the concentration (content) of hydrogen peroxide in the composition is less than 0.002% by mass.

[Method for Using Composition]

The temperature at which the composition of the present invention is used is usually 20 to 70° C., preferably 30 to 60° C., and particularly preferably 40 to 55° C. It may be suitably selected depending on conditions for dry etching and the constitution of a semiconductor substrate to be used.

The time for use of the composition of the present invention is usually 0.2 to 60 minutes. It may be suitably selected depending on conditions for dry etching and the constitution of a semiconductor substrate to be used.

The composition of the present invention can be used, for example, by bringing the composition into contact with the surface of a semiconductor substrate. According to a preferred embodiment of the present invention, by bringing the composition of the present invention into contact with the surface of the semiconductor substrate, a dry etching residue can be removed from the surface of the semiconductor substrate. According to a particularly preferred embodiment of the present invention, when the semiconductor substrate has an alumina layer containing alumina, a dry etching residue can be removed from the surface of the semiconductor substrate while suppressing damage to alumina contained in the alumina layer.

The method for bringing the composition of the present invention into contact with the surface of the semiconductor substrate is not particularly limited. For example, it is possible to employ a method of bringing the composition of the present invention into contact with the surface of the semiconductor substrate by means of dropping (single wafer spin process), spray or the like, a method of immersing the semiconductor substrate in the composition of the present invention, or the like. In the present invention, either of such methods may be employed.

As a rinse liquid to be used after use of the composition of the present invention, both an organic solvent and water can be used.

[Semiconductor Substrate]

The semiconductor substrate for which the composition of the present invention can be suitably used is a substrate, wherein:

a substrate material such as silicon, amorphous silicon, polysilicon and glass;

an dielectric material such as silicon oxide, silicon nitride, silicon carbide and derivatives thereof;

a material such as cobalt, cobalt alloy, tungsten and titanium-tungsten;

a compound semiconductor such as gallium-arsenic, gallium-phosphorus, indium-phosphorus, indium-gallium-arsenic and indium-aluminum-arsenic and an oxide semiconductor such as chromium oxide, in particular, a low-dielectric-constant interlayer dielectric film are used. The semiconductor substrate having any of such materials preferably has an alumina layer containing alumina. Specifically, for example, the semiconductor substrate has the alumina layer as an etch stop layer or the like.

The content of alumina in the alumina layer is preferably 30% by mass or more, more preferably 50% by mass or more, even more preferably 70% by mass or more, still more preferably 90% by mass or more, and particularly preferably 100% by mass.

The dry etching residue to be removed in the present invention is, for example, generated at the time of forming a via or trench in the low-dielectric-constant interlayer dielectric film by means of dry etching using a titanium-based or zirconia-based hard mask as a mask. In this case, a part of the dry etching residue is generated when an etching gas comes into contact with the titanium-based or zirconia-based hard mask. Accordingly, the dry etching residue to be removed usually contains titanium or zirconium.

It is preferred that the composition of the present invention can sufficiently suppress damage to alumina in the step of removing the dry etching residue. For example, the etching rate of alumina in the case where the semiconductor substrate is immersed in the composition of the present invention and the measurement is carried out at 50° C. is preferably 40 Å/min ($4.0 \times 10^{-9}$ m/min) or lower, more preferably 35 Å/min ($3.5 \times 10^{-9}$ m/min) or lower, even more preferably 33 Å/min ($3.3 \times 10^{-9}$ m/min) or lower, and particularly preferably 15 Å/min ($1.5 \times 10^{-9}$ m/min) or lower.

Further, in one embodiment of the present invention, when the semiconductor substrate has cobalt or a cobalt alloy and a low-dielectric-constant interlayer dielectric film in addition to alumina, it is more preferred that damage to these materials can be suppressed.

For example, the etching rate of cobalt in the case where the semiconductor substrate is immersed in the composition of the present invention and the measurement is carried out at 50° C. is preferably 5.0 Å/min ($5.0 \times 10^{-10}$ m/min) or lower, more preferably 3.0 Å/min ($3.0 \times 10^{-10}$ m/min) or lower, even more preferably 1.0 Å/min ($1.0 \times 10^{-10}$ m/min) or lower, still more preferably 0.5 Å/min ($0.5 \times 10^{-10}$ m/min) or lower, and particularly preferably 0.3 Å/min ($0.3 \times 10^{-10}$ m/min) or lower.

Further, the etching rate of the low-dielectric-constant interlayer dielectric film in the case where the semiconductor substrate is immersed in the composition of the present invention and the measurement is carried out at 50° C. is 5.0 Å/min ($5.0 \times 10^{-10}$ m/min) or lower, more preferably 3.0 Å/min ($3.0 \times 10^{-10}$ m/min) or lower, even more preferably 1.0 Å/min ($1.0 \times 10^{-10}$ m/min), still more preferably 0.5 Å/min ($0.5 \times 10^{-10}$ m/min) or lower, and particularly preferably 0.2 Å/min ($0.2 \times 10^{-10}$ m/min) or lower.

[Method for Producing Semiconductor Substrate Having Alumina Layer]

The method for producing the semiconductor substrate of the present invention includes removing a dry etching residue using the composition of the present invention. For example, the method includes removing a dry etching residue from the surface of a semiconductor substrate, wherein, after a via or trench is formed by dry etching, the semiconductor substrate having an alumina layer prior to removal of the dry etching residue is brought into contact with the composition of the present invention.

The temperature and the time for use of the composition of the present invention are as described in [Method for using composition] above. The semiconductor substrate having an alumina layer is as described in [Semiconductor substrate] above. The method for bringing the composition of the present invention into contact with the surface of the semiconductor substrate having the alumina layer is not particularly limited. For example, it is possible to employ a method of bringing the composition of the present invention into contact with the surface of the semiconductor substrate by means of dropping (single wafer spin process), spray or the like, a method of immersing the semiconductor substrate in the composition of the present invention, or the like. In the present invention, either of such methods may be employed.

FIGS. 1 to 4 show examples of a cross-section structure of a semiconductor substrate having an alumina layer after forming a via by means of dry etching and before removing a dry etching residue.

FIG. 1 is a schematic cross sectional view of a semiconductor substrate prior to removal of a dry etching residue, which has a structure comprising a low-dielectric-constant interlayer dielectric film, cobalt or cobalt alloy, alumina and a titanium-based hard mask, wherein the bottom of a via is alumina, according to one embodiment. In FIG. 1, on a semiconductor base material, cobalt or cobalt alloy 3 as a wiring material and alumina 4 as an etch stop layer are layered, and a low-dielectric-constant interlayer dielectric film 5 and a titanium-based hard mask 2 are further layered thereon in this order. The bottom of a via is alumina 4, and a titanium-based dry etching residue 1 adheres to the surfaces of the via and the titanium-based hard mask 2.

Figure 2:
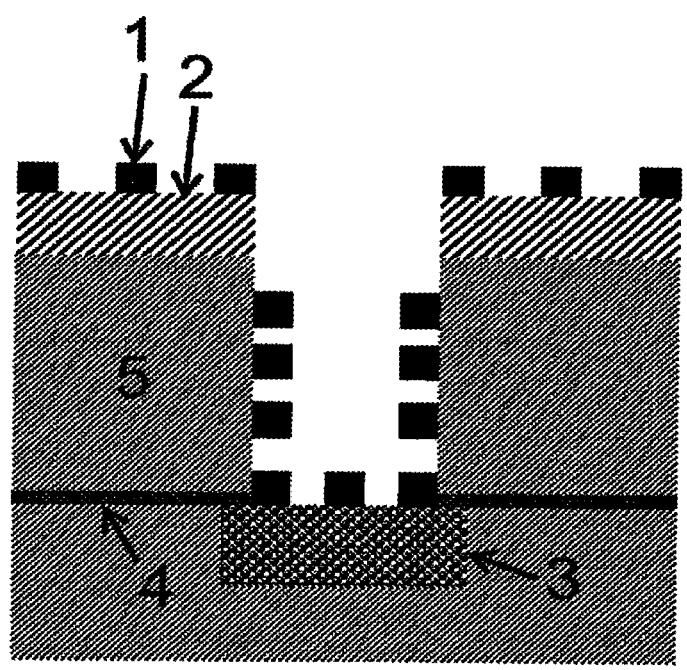
FIG. 2 is a schematic cross sectional view of a semiconductor substrate prior to removal of a dry etching residue, which has a structure comprising a low-dielectric-constant interlayer dielectric film, cobalt or cobalt alloy, alumina and a titanium-based hard mask, wherein the bottom of a via is cobalt or cobalt alloy, according to one embodiment.

FIG. 2 is a schematic cross sectional view of a semiconductor substrate prior to removal of a dry etching residue, which has a structure comprising a low-dielectric-constant interlayer dielectric film, cobalt or cobalt alloy, alumina and a titanium-based hard mask, wherein the bottom of a via is cobalt or cobalt alloy, according to one embodiment. In FIG. 2, on a semiconductor base material, cobalt or cobalt alloy 3 as a wiring material and alumina 4 as an etch stop layer are layered, and a low-dielectric-constant interlayer dielectric film 5 and a titanium-based hard mask 2 are further layered thereon in this order. The bottom of a via is cobalt or cobalt alloy 3, and a titanium-based dry etching residue 1 adheres to the surfaces of the via and the titanium-based hard mask 2.

Figure 3:
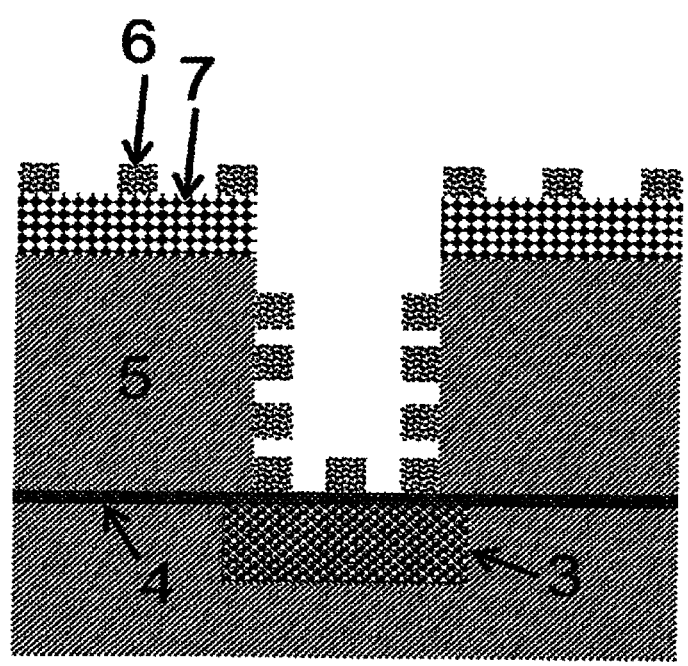
FIG. 3 is a schematic cross sectional view of a semiconductor substrate prior to removal of a dry etching residue, which has a structure comprising a low-dielectric-constant interlayer dielectric film, cobalt or cobalt alloy, alumina and a zirconia-based hard mask, wherein the bottom of a via is alumina, according to one embodiment.

FIG. 3 is a schematic cross sectional view of a semiconductor substrate prior to removal of a dry etching residue, which has a structure comprising a low-dielectric-constant interlayer dielectric film, cobalt or cobalt alloy, alumina and a zirconia-based hard mask, wherein the bottom of a via is alumina, according to one embodiment. In FIG. 3, on a semiconductor base material, cobalt or cobalt alloy 3 as a wiring material and alumina 4 as an etch stop layer are layered, and a low-dielectric-constant interlayer dielectric film 5 and a zirconia-based hard mask 7 are further layered thereon in this order. The bottom of a via is alumina 4, and a zirconia-based dry etching residue 6 adheres to the surfaces of the via and the zirconia-based hard mask 7.

Figure 4:
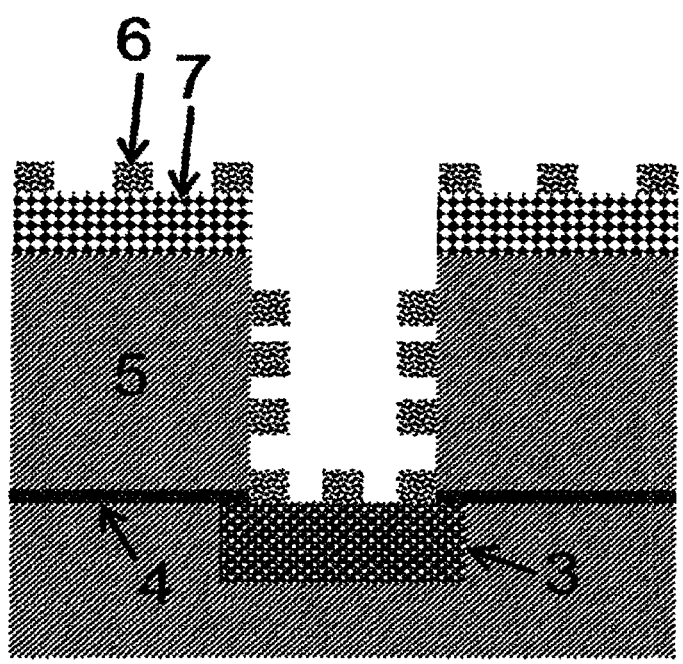
FIG. 4 is a schematic cross sectional view of a semiconductor substrate prior to removal of a dry etching residue, which has a structure comprising a low-dielectric-constant interlayer dielectric film, cobalt or cobalt alloy, alumina and a zirconia-based hard mask, wherein the bottom of a via is cobalt or cobalt alloy, according to one embodiment.

FIG. 4 is a schematic cross sectional view of a semiconductor substrate prior to removal of a dry etching residue, which has a structure comprising a low-dielectric-constant interlayer dielectric film, cobalt or cobalt alloy, alumina and a zirconia-based hard mask, wherein the bottom of a via is cobalt or cobalt alloy, according to one embodiment. In FIG. 4, on a semiconductor base material, cobalt or cobalt alloy 3 as a wiring material and alumina 4 as an etch stop layer are layered, and a low-dielectric-constant interlayer dielectric film 5 and a zirconia-based hard mask 7 are further layered thereon in this order. The bottom of a via is cobalt or cobalt alloy 3, and a zirconia-based dry etching residue 6 adheres to the surfaces of the via and the zirconia-based hard mask 7.

In the method for producing the semiconductor substrate of the present invention, the semiconductor substrate having the alumina layer prior to removal of the dry etching residue is brought into contact with the composition of the present invention, thereby removing the dry etching residue from the surface of the semiconductor substrate. Accordingly, it is possible to produce the semiconductor substrate with a high yield. According to a preferred embodiment of the present invention, damage to alumina contained in the alumina layer can be sufficiently suppressed in the process of removing the dry etching residue. Further, in one embodiment of the present invention, when the semiconductor substrate has cobalt or a cobalt alloy and a low-dielectric-constant interlayer dielectric film in addition to alumina, damage to these materials can be suppressed. Accordingly, it is possible to produce the semiconductor substrate without affecting electrical properties.

[Method for Washing Semiconductor Substrate Having Alumina Layer]

The method for washing the semiconductor substrate of the present invention includes removing a dry etching residue using the composition of the present invention. For example, the method includes removing a dry etching residue from the surface of a semiconductor substrate, wherein, after a via or trench is formed by dry etching, the semiconductor substrate having an alumina layer prior to removal of the dry etching residue is brought into contact with the composition of the present invention.

The temperature and the time for use of the composition of the present invention are as described in [Method for using composition] above. The method for bringing the composition of the present invention into contact with the surface of the semiconductor substrate having the alumina layer is as described in [Method for producing semiconductor substrate having alumina layer] above. Further, the semiconductor substrate having the alumina layer to be washed is as described in [Semiconductor substrate] and [Method for producing semiconductor substrate having alumina layer] above.

By using the method for washing the semiconductor substrate of the present invention, a dry etching residue can be removed from the surface of the semiconductor substrate. In a preferred embodiment of the washing method of the present invention, damage to alumina can be sufficiently suppressed in the process of removing a dry etching residue. Further, in one embodiment of the washing method of the present invention, when the semiconductor substrate has cobalt or a cobalt alloy as a wiring material and a low-dielectric-constant interlayer dielectric film, damage to these materials can be sufficiently suppressed. Accordingly, it is possible to produce the semiconductor substrate without affecting electrical properties.

EXAMPLES

Hereinafter, the present invention will be specifically described based on working examples, but embodiments can be suitably changed within a range in which the effects of the present invention are exerted.

Note that "%" means "% by mass" unless otherwise specified.

[Wafer for Evaluation]
<Wafer for Evaluation A>: For Evaluation of Removal of Titanium (Ti)-Based Residue From bottom to top, films of silicon nitride, an interlayer dielectric film, silicon nitride, titanium oxide and a photoresist were formed, and then the photoresist was patterned.

A predetermined part of a hard mask was removed by dry etching using the photoresist as a mask, and the photoresist was removed by ashing with oxygen plasma. In addition, a via was formed in the silicon nitride film and the interlayer dielectric film by dry etching using the hard mask as a mask.
<Wafer for Evaluation B>: For Evaluation of Removal of Zirconia (Zr)-Based Residue From bottom to top, films of silicon nitride, an interlayer dielectric film, silicon nitride, zirconia and a photoresist were formed, and then the photoresist was patterned.

A predetermined part of a hard mask was removed by dry etching using the photoresist as a mask, and the photoresist was removed by ashing with oxygen plasma. In addition, a via was formed in the silicon nitride film and the interlayer dielectric film by dry etching using the hard mask as a mask.
<Wafer with Film>: For Evaluation of Damage to Alumina, Cobalt and Low-Dielectric-Constant Interlayer Dielectric Film Caused by Composition Wafers with a film in which films of alumina, cobalt and a low-dielectric-constant interlayer dielectric film (TEOS (tetraethoxysilicate)) were respectively formed on each wafer (a wafer with an alumina film, a wafer with a cobalt film and a wafer with a TEOS film) were used.
[Evaluation Methods]
<Evaluation of Removal of Residue>

The wafer for evaluation A and the wafer for evaluation B after treated with each composition were subjected to SEM observation.

Measurement apparatus: Ultra-high resolution field-emission scanning electron microscope SU9000 manufactured by Hitachi High-Technologies Corporation (100,000×)
Judgment Method:
E: The dry etching residue was completely removed.
G: The dry etching residue was almost completely removed.
P: The dry etching residue was insufficiently removed.
E and G were regarded as acceptable.
<E.R. (Etching Rate)>

Each wafer with film was treated with the composition at 50° C., and E.R. was calculated by dividing the difference between the film thicknesses before and after the treatment by the treatment time. The film thickness of each wafer with each film was measured by using X-Ray Fluorescent Analyzer SEA1200VX manufactured by SII Nano Technology Inc. (film thickness measurement apparatus A) or an optical film thickness gauge n&k 1280 manufactured by n&k Technology Inc. (film thickness measurement apparatus B). The film thickness measurement apparatus A was used for the wafer with the cobalt film, and the film thickness measurement apparatus B was used for the wafer with the alumina film and the wafer with the TEOS film, and each film thickness was measured.

Alumina: the case where E.R. was 40 Å/min or lower
Cobalt: the case where E.R. was 1.0 Å/min or lower
TEOS: the case where E.R. was 1.0 Å/min or lower
The above-described cases were regarded as "good product".

Examples 1-8 and Comparative Examples 1-12

The wafer for evaluation A, the wafer for evaluation B and the wafer with the alumina film were used in the test. Each wafer was immersed in a composition shown in Table 1 at 50° C. After that, rinsing with ultrapure water and drying by dry nitrogen gas jet were carried out. The wafer for evaluation A and the wafer for evaluation B were subjected to the immersion treatment for 1 minute in all the cases and the wafer after the treatment was observed by SEM.

The wafer with the alumina film was subjected to the immersion treatment for 5 minutes, and E.R. was calculated from film thicknesses before and after the treatment (regarding Comparative Examples, since the alumina film was completely dissolved by the immersion treatment for 5 minutes, in Comparative Examples other than Comparative Example 11, the immersion treatment was carried out for 30 seconds and E.R. was calculated).

The pH of each composition was measured by using a pH meter (pH meter F-52 manufactured by HORIBA, Ltd.) at 25° C.

It is understood that in Examples 1-8, the dry etching residue was completely removed while damage to alumina was prevented.

Meanwhile, it is understood that the compositions of Comparative Examples cannot be used for the purpose of suppressing damage to alumina and removing the dry etching residue on the surface of the product to be treated. In particular, it is understood that in Comparative Examples 4-10, the cation contained in the salt was changed to Be, Mg, Ca, and Sr belonging to the same group as barium, but similar effects as those of a barium salt were not obtained.

TABLE 1

| | Ba compound (A) | Fluorine compound (B) | Other components | H2O | pH | Residue removability Ti-based | Zr-based | E.R. (Å/min) Al$_2$O$_3$ |
|---|---|---|---|---|---|---|---|---|
| Example 1 | Ba nitrate (0.005) | NH$_4$F (1.0) | — | 99.0 | 5.8 | E | E | 7 |
| Example 2 | Ba acetate (0.005) | NH$_4$F (1.0) | — | 99.0 | 5.9 | E | E | 8 |
| Example 3 | Ba chloride (0.005) | NH$_4$F (1.0) | — | 99.0 | 5.9 | E | E | 7 |
| Example 4 | Ba nitrate (0.1) | HF•KF (0.1) | — | 99.8 | 3.9 | E | E | 3 |
| Example 5 | Ba nitrate (0.001) | NH$_4$F (0.3) | — | 99.7 | 6.6 | G | E | 33 |
| Example 6 | Ba nitrate (0.1) | Hydrofluoric acid (0.05) | — | 99.9 | 3.1 | E | E | 5 |
| Example 7 | Ba nitrate (0.05) | NH$_4$F (10) | — | 90.0 | 7.1 | E | E | 10 |
| Example 8 | Ba nitrate (0.005) | NH$_4$F (1.0) | DGBE (50) | 49.0 | 6.9 | E | E | 29 |
| Comparative Example 1 | — | NH$_4$F (1.0) | — | 99.0 | 5.8 | E | E | 144 |
| Comparative Example 2 | — | Hydrofluoric acid (0.05) | — | 100.0 | 3.1 | E | E | 86 |
| Comparative Example 3 | — | HF•KF (0.1) | — | 99.9 | 3.8 | E | E | 350 |
| Comparative Example 4 | — | NH$_4$F (1.0) | Mg nitrate (0.005) | 99.0 | 6 | E | E | 110 |
| Comparative Example 5 | — | NH$_4$F (1.0) | Ca nitrate (0.005) | 99.0 | 6 | E | E | 100 |
| Comparative Example 6 | — | NH$_4$F (1.0) | Sr nitrate (0.005) | 99.0 | 6 | E | E | 120 |
| Comparative Example 7 | — | NH$_4$F (1.0) | Be sulfate (2.0) | 97.0 | 6 | E | E | 142 |
| Comparative Example 8 | — | NH$_4$F (1.0) | Mg nitrate (2.0) | 97.0 | 6 | E | E | 140 |
| Comparative Example 9 | — | NH$_4$F (1.0) | Ca nitrate (2.0) | 97.0 | 6 | E | E | 140 |
| Comparative Example 10 | — | NH$_4$F (1.0) | Sr nitrate (2.0) | 97.0 | 6 | E | E | 146 |
| Comparative Example 11 | Ba nitrate (0.005) | NH$_4$F (1.0) | Ammonia (0.1) | 98.9 | 8.9 | P | P | 12 |
| Comparative Example 12 | Ba nitrate (0.1) | Hydrofluoric acid (0.05) | Nitric acid (0.01) | 99.8 | 1.7 | E | E | 120 |

DGBE: diethylene glycol monobutyl ether

Examples 9-13

Evaluation was made with respect to compositions in Table 2 in which the benzotriazole compound (C) and the compound (D) having a pyrrolidone structure were used in combination. The wafer for evaluation A, the wafer for evaluation B, the wafer with the alumina film, the wafer with the cobalt film and the wafer with the TEOS film were used in the test. Each wafer was immersed in a composition shown in Table 2 at 50° C. After that, rinsing with ultrapure water and drying by dry nitrogen gas jet were carried out. The wafer for evaluation A and the wafer for evaluation B were subjected to the immersion treatment for 1 minute like Examples 1-8, and the wafer after the treatment was observed by SEM. The wafer with the alumina film was subjected to the immersion treatment for 5 minutes like Examples 1-8, and E.R. was calculated. The wafer with the cobalt film and the wafer with the TEOS film were subjected to the immersion treatment for 30 minutes, and E.R. was calculated. It is understood that in Examples 9 and 10, the dry etching residue was completely removed while damage to alumina and cobalt was prevented. Moreover, it is understood that in Examples 11-13, the dry etching residue was completely removed while damage to alumina, cobalt and the low-dielectric-constant interlayer dielectric film was prevented.

TABLE 2

| | Ba compound (A) | Fluorine compound (B) | Benzotriazole compound (C) | Pyrrolidone compound (D) | H$_2$O | pH | Residue removability Ti-based | Zr-based | E.R. (Å/min) Al$_2$O$_3$ | Co | TEOS |
|---|---|---|---|---|---|---|---|---|---|---|---|
| Example 9 | Ba nitrate (0.005) | NH$_4$F (1.0) | 5-MBT (0.1) | — | 98.9 | 6 | E | G | 12 | 0.2 | — |
| Example 10 | Ba nitrate (0.005) | NH$_4$F (1.0) | TTLYK (0.2) | — | 98.8 | 7.4 | G | G | 8 | 0.1 | — |
| Example 11 | Ba nitrate (0.005) | NH$_4$F (1.0) | BT (1.0) | PVP-K90 (0.003) | 98.0 | 6 | E | E | 10 | 0.1 | 0.1 |
| Example 12 | Ba nitrate (0.005) | NH$_4$F (1.0) | BT (1.0) | PVP-K12 (0.1) | 97.9 | 6 | E | E | 9 | 0.3 | 0.2 |
| Example 13 | Ba nitrate (0.005) | NH$_4$F (1.0) | BT (1.0) | VPVA73 (0.05) | 97.9 | 6 | E | E | 9 | 0.3 | 0.2 |

5-MBT: 5-methyl-1H-benzotriazole
TTLYK: 2,2'-[[(methyl-1H-benzotriazol-1-yl)methyl]imino]bisethanol
BT: benzotriazole
PVP-K90: polyvinylpyrrolidone (weight average molecular weight: 1200000)
PVP-K12: polyvinylpyrrolidone (weight average molecular weight: 2000)
VPVA73: vinylpyrrolidone-vinyl acetate copolymer (ratio of repeat unit of vinylpyrrolidone unit: 70%)

REFERENCE SIGNS LIST

1: titanium-based dry etching residue
2: titanium-based hard mask
3: cobalt or cobalt alloy
4: alumina
5: low-dielectric-constant interlayer dielectric film
6: zirconia-based dry etching residue
7: zirconia-based hard mask

The invention claimed is:

1. A method for producing a semiconductor substrate having an alumina layer, the method comprising: removing a dry etching residue using a composition, comprising: from 0.00005 to 1% by mass of a barium compound (A) and from 0.01 to 20% by mass of a fluorine compound (B), and which has a pH of 2.5 to 8.0, wherein a content of hydrogen peroxide in the composition is less than 0.002% by mass.

2. The method according to claim 1, wherein the barium compound (A) comprises at least one selected from the group consisting of barium nitrate, barium acetate, barium chloride, barium hydroxide, barium sulfite, barium chlorate, barium perchlorate, barium peroxide, barium chromate, barium oxide, barium cyanide, barium bromide, barium carbonate, barium metaborate, barium iodide, barium tetrafluoroborate, barium sulfate and barium sulfide.

3. The method according to claim 1, wherein the barium compound (A) comprises at least one selected from the group consisting of barium nitrate, barium acetate, barium chloride and barium hydroxide.

4. The method according to claim 1, wherein the fluorine compound (B) comprises hydrofluoric acid or a fluoride salt.

5. The method according to claim 1, which has a pH of 3.1 to 7.4.

6. The method according to claim 1, further comprising from 0.01 to 10% by mass of a benzotriazole compound (C).

7. The method according to claim 1, further comprising from 0.0005 to 1% by mass of a compound (D) having a pyrrolidone structure.

8. The method according to claim 1, wherein an etching rate of alumina at 50° C. is 40 Å/min ($4.0 \times 10^{-9}$ m/min) or lower.

9. The method according to claim 1, wherein an etching rate of cobalt at 50° C. is 1.0 Å/min ($1.0 \times 10^{-10}$ m/min) or lower.

10. The method according to claim 1, wherein an etching rate of a low-dielectric-constant interlayer dielectric film at 50° C. is 1.0 Å/min ($1.0 \times 10^{-10}$ m/min) or lower.

11. The method according to claim 1, which is suitable for removing a dry etching residue on a semiconductor substrate having an alumina layer.

12. A method for washing a semiconductor substrate having an alumina layer, the method comprising: removing a dry etching residue using a composition comprising: from 0.00005 to 1% by mass of a barium compound (A) and from 0.01 to 20% by mass of a fluorine compound (B), and which has a pH of 2.5 to 8.0, wherein a content of hydrogen peroxide in the composition is less than 0.002% by mass.

13. The method according to claim 12, wherein the barium compound (A) comprises at least one selected from the group consisting of barium nitrate, barium acetate, barium chloride, barium hydroxide, barium sulfite, barium chlorate, barium perchlorate, barium peroxide, barium chromate, barium oxide, barium cyanide, barium bromide, barium carbonate, barium metaborate, barium iodide, barium tetrafluoroborate, barium sulfate and barium sulfide.

14. The method according to claim 12, wherein the barium compound (A) comprises at least one selected from the group consisting of barium nitrate, barium acetate, barium chloride and barium hydroxide.

15. The method according to claim 12, wherein the fluorine compound (B) comprises hydrofluoric acid or a fluoride salt.

16. The method according to claim 12, further comprising from 0.01 to 10% by mass of a benzotriazole compound (C).

17. The method according to claim 12, further comprising from 0.0005 to 1% by mass of a compound (D) having a pyrrolidone structure.

18. The method according to claim 12, which is suitable for removing a dry etching residue on a semiconductor substrate having an alumina layer.

* * * * *